US009190173B2

(12) United States Patent
Kobla et al.

(10) Patent No.: US 9,190,173 B2
(45) Date of Patent: Nov. 17, 2015

(54) GENERIC DATA SCRAMBLER FOR MEMORY CIRCUIT TEST ENGINE

(75) Inventors: Darshan Kobla, Austin, TX (US); David Zimmerman, El Dorado Hills, CA (US); John C. Johnson, Phoenix, AZ (US); Vimal K. Natarajan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,156

(22) PCT Filed: Mar. 30, 2012

(86) PCT No.: PCT/US2012/031430
§ 371 (c)(1),
(2), (4) Date: Sep. 20, 2013

(87) PCT Pub. No.: WO2013/147841
PCT Pub. Date: Oct. 3, 2013

(65) Prior Publication Data
US 2014/0013169 A1    Jan. 9, 2014

(51) Int. Cl.
*G11C 29/00*    (2006.01)
*G11C 29/18*    (2006.01)
*G11C 29/36*    (2006.01)
*G11C 11/40*    (2006.01)

(52) U.S. Cl.
CPC ............ *G11C 29/18* (2013.01); *G11C 29/36* (2013.01); *G11C 11/40* (2013.01)

(58) Field of Classification Search
None
See application file for complete search history.

(56) References Cited

U.S. PATENT DOCUMENTS

| 4,453,212 | A | * | 6/1984 | Gaither et al. ..................... 711/2 |
| 4,928,223 | A | * | 5/1990 | Dao et al. ...................... 712/247 |
| 5,197,132 | A | * | 3/1993 | Steely et al. ................... 712/217 |
| 5,961,634 | A | * | 10/1999 | Tran .............................. 712/218 |
| 6,452,848 | B1 |   | 9/2002 | Obremski et al. |

(Continued)

FOREIGN PATENT DOCUMENTS

| JP | 2001-243793 | 9/2001 |
| JP | 2008-269669 | 11/2008 |

(Continued)

OTHER PUBLICATIONS

International Search Report and Written Opinion of the International Searching Authority dated Nov. 23, 2012, in International Patent Application No. PCT/US2012/031430, 7 pages.

(Continued)

*Primary Examiner* — Daniel McMahon
(74) *Attorney, Agent, or Firm* — Blakely, Sokoloff, Taylor & Zafman LLP

(57) ABSTRACT

A generic data scrambler is provided for a built-in self-test (BIST) engine of a stacked memory device. The stacked memory device includes a memory stack of one or more memory layers; and a system element that is coupled with the memory stack. The system element includes a memory controller for the memory stack; a BIST circuit for testing of the memory stack; and a generic data scrambler for scrambling of data according to a data scrambling algorithm for the memory stack. The generic data scrambler includes a programmable lookup table to hold data factors for each possible outcome of the data scrambling algorithm, and the programmable lookup table is to generate a set of data factors based on addresses of data for testing of the memory stack.

25 Claims, 8 Drawing Sheets

(56) References Cited

U.S. PATENT DOCUMENTS

| | | | |
|---|---|---|---|
| 6,658,611 B1 | 12/2003 | Jun | |
| 7,302,623 B2 * | 11/2007 | Kang | 714/718 |
| 7,444,575 B2 * | 10/2008 | Ong | 714/742 |
| 7,676,709 B2 | 3/2010 | Chan | |
| 8,208,326 B1 | 6/2012 | Solt et al. | |
| 2006/0233012 A1 | 10/2006 | Sekiguchi et al. | |
| 2007/0143568 A1 | 6/2007 | Gould | |
| 2007/0208970 A1 | 9/2007 | Marinissen et al. | |
| 2008/0178053 A1 * | 7/2008 | Gorman et al. | 714/718 |
| 2008/0263414 A1 | 10/2008 | Saito et al. | |
| 2009/0059641 A1 * | 3/2009 | Jeddeloh | 365/63 |
| 2009/0103345 A1 | 4/2009 | McLaren et al. | |
| 2009/0224388 A1 * | 9/2009 | Bernstein et al. | 257/686 |
| 2009/0295420 A1 * | 12/2009 | Shiba | 324/763 |
| 2010/0332177 A1 | 12/2010 | Wu et al. | |
| 2011/0161748 A1 | 6/2011 | Casper et al. | |
| 2013/0294184 A1 * | 11/2013 | Yang et al. | 365/200 |
| 2014/0237307 A1 * | 8/2014 | Kobla et al. | 714/723 |

FOREIGN PATENT DOCUMENTS

| | | |
|---|---|---|
| KR | 10-1086924 | 11/2011 |
| TW | 201101316 | 1/2011 |
| WO | WO-2013/101006 | 7/2013 |

OTHER PUBLICATIONS

International Search Report and Written Opinion of the International Searching Authority dated Sep. 19, 2012, in International Patent Application No. PCT/US2011/067674, 9 pages.

Non-Final Office Action mailed Apr. 22, 2015, in U.S. Appl. No. 13/997,641, 13 pages.

Official Letter dated Apr. 13, 2015 (+ English translation), in Taiwan Patent Application No. 101147162, 6 pages.

Notice of Reasons for Rejection dated Jul. 7, 2015 (+ English translation), in Japanese Patent Application No. 2014-550256, 4 pages.

* cited by examiner

GENERIC DATA SCRAMBLER FOR MEMORY CIRCUIT TEST ENGINE

TECHNICAL FIELD

Embodiments of the invention generally relate to the field of electronic devices and, more particularly, to a generic data scrambler for a memory circuit test engine.

BACKGROUND

To provide more dense memory for computing operations, concepts involving memory devices (which may be referred to as 3D stacked memory, or stacked memory) having a plurality of closely coupled memory elements have been developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

As memory devices increase in size and complexity, there is an increase need for effective and efficient testing of such devices, where testing may include data scrambling to provide for full testing. An external device such as an ATE (Automatic Test Equipment) tester may include a data scrambler.

However, the memory dies within a stacked memory device may vary in design, and in particular such memory may vary in the data scrambling utilized in the memory.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
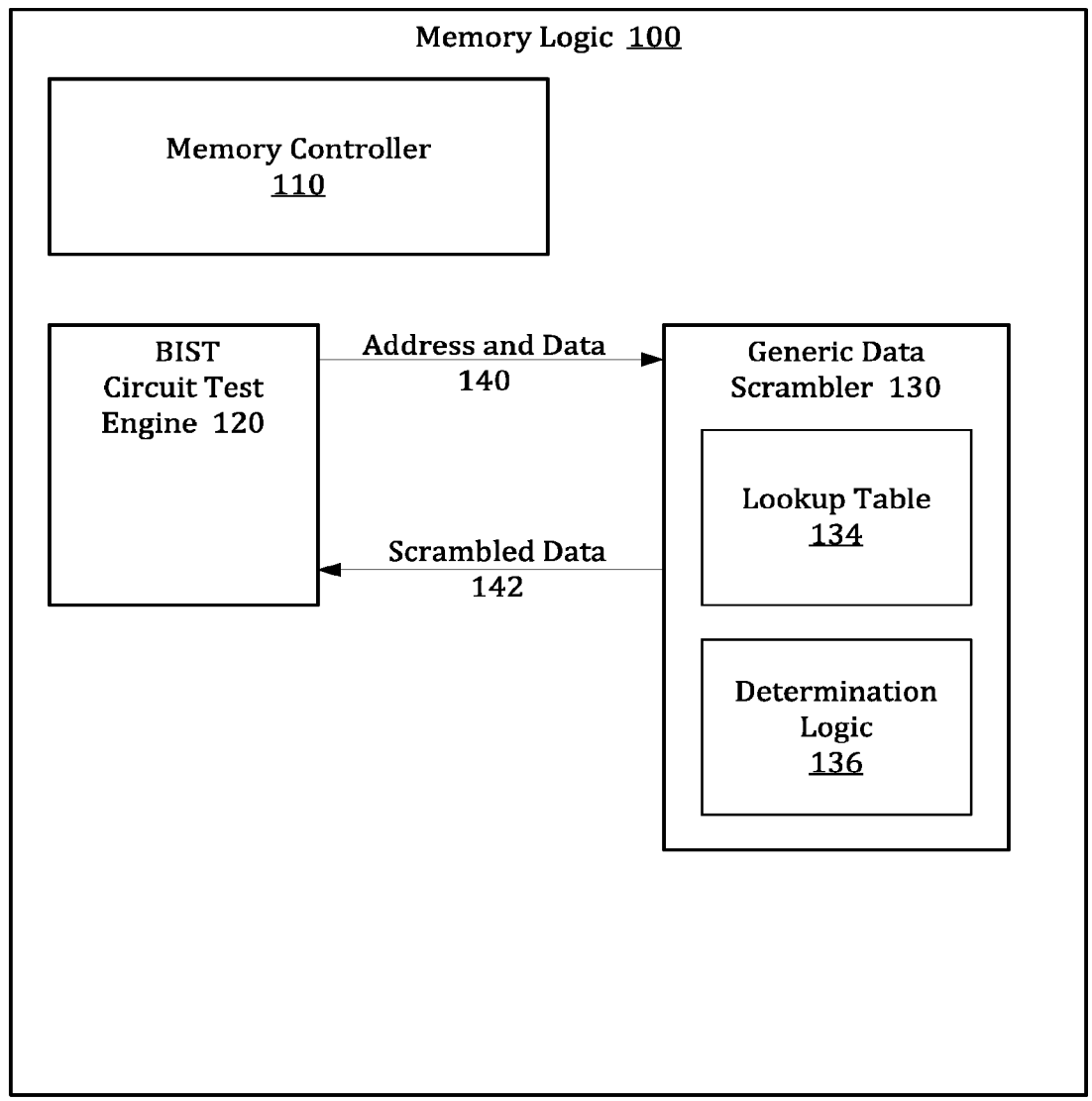
FIG. 1 illustrates an embodiment of logic of a stacked memory device including a generic data scrambler.

Embodiments of the invention are generally directed to a generic data scrambler for a circuit test engine.

As used herein:

"3D stacked memory" (where 3D indicates three-dimensional) or "stacked memory" means a computer memory including multiple coupled memory layers, memory packages, or other memory elements. The memory may be vertically stacked or horizontally (such as side by side) stacked, or otherwise contain memory elements that are coupled together. In particular, a stacked memory DRAM device or system may include a memory device having a plurality of DRAM layers. A stacked memory device may also include system elements in the device, such as a CPU (central processing unit), a memory controller, and other related system elements. The system layer may include a logic chip or a system on chip (SoC). A stacked memory device may include through silicon vias (TSVs) for providing interconnections between die layers. In some embodiments, the logic chip may be an application processor or graphics processing unit (GPU).

In some embodiments, a generic data scrambler for a built-in self-test (BIST) engine of a memory device is provided.

With the advent of stacked memory, and specifically the WideIO DRAM standard, one or more DRAM wafers are stacked with a SoC (System on Chip) wafer or system element in the same package, which may include use of through silicon via (TSV) manufacturing techniques. The combination of TSV and Wide IO DRAM (and future standards) may result in area savings, platform power savings, and an increase in performance.

However, a stacked memory architecture creates implications regarding data testing. To test memories effectively, data is to be written based on physical location. Logical to physical data mapping (L2P) does not typically have a one-to-one relationship between logical and physical location, and is generally governed by a scrambling function. A data scrambling function can vary in implementation from a simple wire connectivity remapping of the data bits to mapping requiring combinational gates or a function of address. A highly complex case is the case of data scrambling that is a function of address. In operation, a memory device may utilize data scrambling in the storage of data. In a conventional device, data scrambling is generally hard-coded according to a particular data scrambling scheme.

A stacked memory device includes a system element that is coupled with a memory stack. The memory stack includes one or more memory dies, where such memory dies may be manufactured by various different manufactures, where such manufacturers may utilize different address scrambling algorithms. In testing there is a need to understand how stored data corresponds with the physical memory, which will vary based on the data scrambling algorithm in use for a particular DRAM memory.

In some embodiments, a memory device includes a generic data scrambler, where the generic data scrambler may be used to support built-in self-test (BIST) operations for various different memories, where such memories may include memories generated by different manufacturers. In some embodiments, a generic data scrambler may implement multiple different scrambling equations or algorithms. In some embodiments, the BIST and generic data scrambler allow for testing of multiple different types of memory.

In one implementation, a generic data scrambler includes a programmable look up table to obtain data factors for data scrambling, where the data factors are combined, such in XOR operations, with the actual data. In some embodiments, a process may be reversed to allow for an apparatus to descramble stored data in memory testing. In some embodiments, a generic data scrambler for a BIST engine is programmable and the BIST engine is process independent, thus requiring no hardware or design changes for different memories. In some embodiments, the generic data scrambler enables data scrambling for multiple different DRAMs, and may be utilized to provide improved defect detection, which may assist in providing a better manufacturing yield.

In some embodiments, an implementation of a generic data scrambler includes a look up table, a process including pre-computing the values of lookup table values based on address; loading the look up values into the lookup table using a tap input; and manipulating the actual data based on the lookup values from the lookup table.

In some embodiments, a BIST engine with a generic data scrambler may be used by a manufacturer to screen defective parts, such as testing after assembly for one or more of verifying operation of memory of a memory device, and verifying connection of the memory to one or more logic components. When enabled for the OS (operating system) boot, the BIST engine supports power on self test (POST) to detect reliability-related failures. In some embodiments, the generic data scrambler enables a BIST raster (diagnostic) feature during debug to, for example, pinpoint a failing bit. In some embodiments, with the programming of the generic data scrambler, no hardware change is required when a DRAM process changes leads to implementation of new L2P (logical to physical) mapping for the memory.

FIG. 1 illustrates an embodiment of logic of a stacked memory device including a generic data scrambler. In some embodiments, the memory logic 100 of a stacked memory device (such a SoC chip as a WideIO memory device) includes a memory controller 110 for the control of the memory stack, a BIST circuit test engine 120 for testing of the memory, and a generic data scrambler 130 for scrambling data to be stored in DRAM. In the testing of the DRAM, there is a need for determining actual data storage, where such data is scrambled, the data scrambling varying depending on the memory dies included in a stacked memory device.

In some embodiments, the BIST circuit test engine 120 of the memory logic 100 includes a generic programmable data scrambler 130 for mapping of address and data 140 to scrambled data 142. In some embodiments, the generic address scrambler 130 includes a programmable lookup table module or element 134 to scramble (and unscramble) data, where the scrambling may be dependent on the address, and determination logic 136, which may include multiple logic gates.

In some embodiments, the lookup table 134 is operable to be programmed with pre-computed values for any of a plurality of possible data scrambling Boolean equations. The lookup table may be implemented in various ways, including, but not limited to, a register file or set of flip-flops to hold the pre-computed values.

Figure 2:
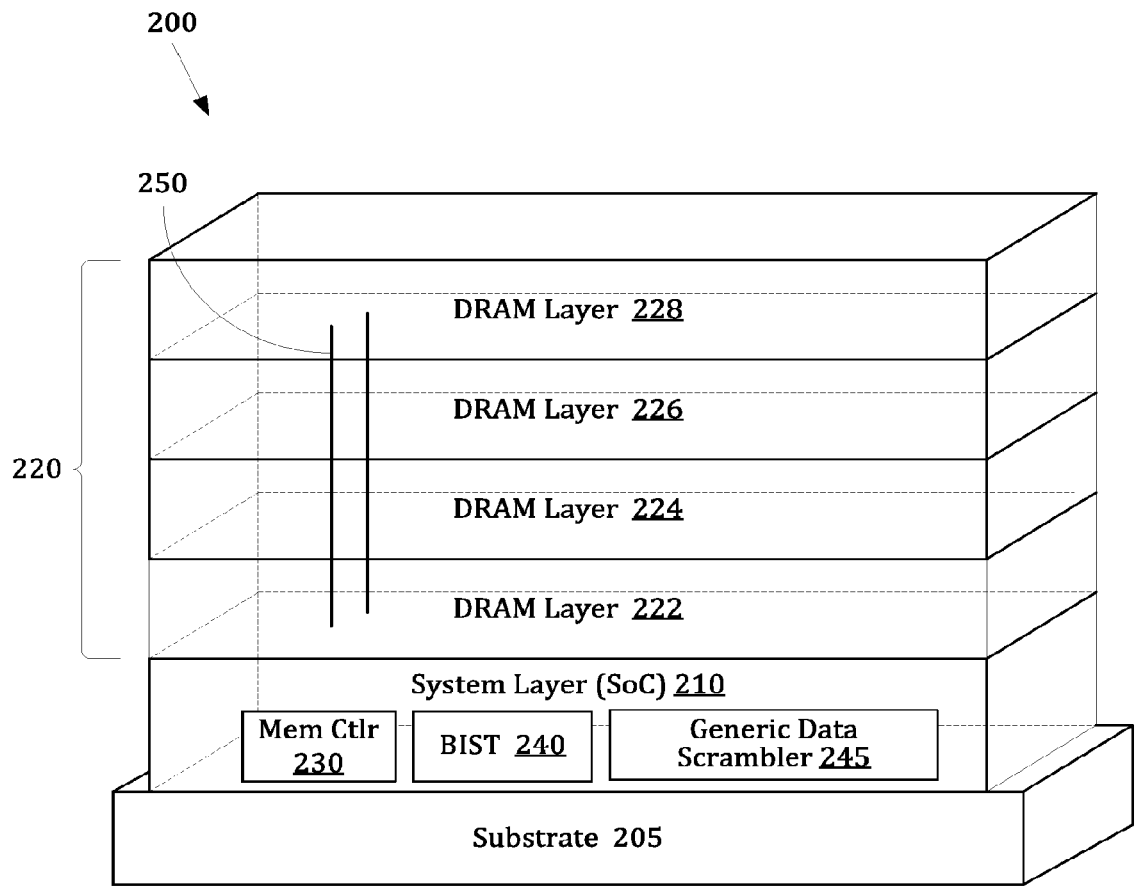
FIG. 2 illustrates an embodiment of a 3D stacked memory providing for memory testing including a generic data scrambler.

FIG. 2 illustrates an embodiment of a 3D stacked memory providing for memory testing including a generic data scrambler. In this illustration, a 3D stacked memory device 200, such as a WideIO memory device, includes a system element 210 on a substrate 205 coupled with one or more DRAM memory die layers 220, also referred to herein as the memory stack. In some embodiments, the system element 210 may be a system on chip (SoC) or other similar element. In this illustration, the DRAM memory die layers include four memory die layers, these layers being a first memory die layer 222, a second memory die layer 224, a third memory die layer 226, and a fourth memory die layer 228. However, embodiments are not limited to any particular number of memory die layers in the memory stack 220, and may include a greater or smaller number of memory die layers. Each die layer may include one or more slices or portions, and may have one or more different channels. Each die layer may include a temperature compensated self-refresh (TCSR) circuit to address thermal issues, where the TCSR and a mode register may be a part of management logic of the device.

Among other elements, the system element 210 may include a memory controller 230, such as a WideIO memory controller, for the memory stack 220. In some embodiments, each memory die layer (with the possible exception of the top (or outermost) memory die layer, such as the fourth memory die layer 228 in this illustration) of the memory stack 220 includes a plurality of through silicon vias (TSVs) 250 to provide paths through the memory die layers.

In some embodiments, the stacked memory device 200 includes BIST logic 240. In some embodiments, the BIST logic is utilized for the testing of the DRAM memory layers. In some embodiments, the memory device 200 further includes a generic data scrambler 245 for use in conjunction with the BIST for the testing of the memory stack 220. In some embodiments, the generic data scrambler 245 may include elements illustrated in FIG. 1.

Figure 3:
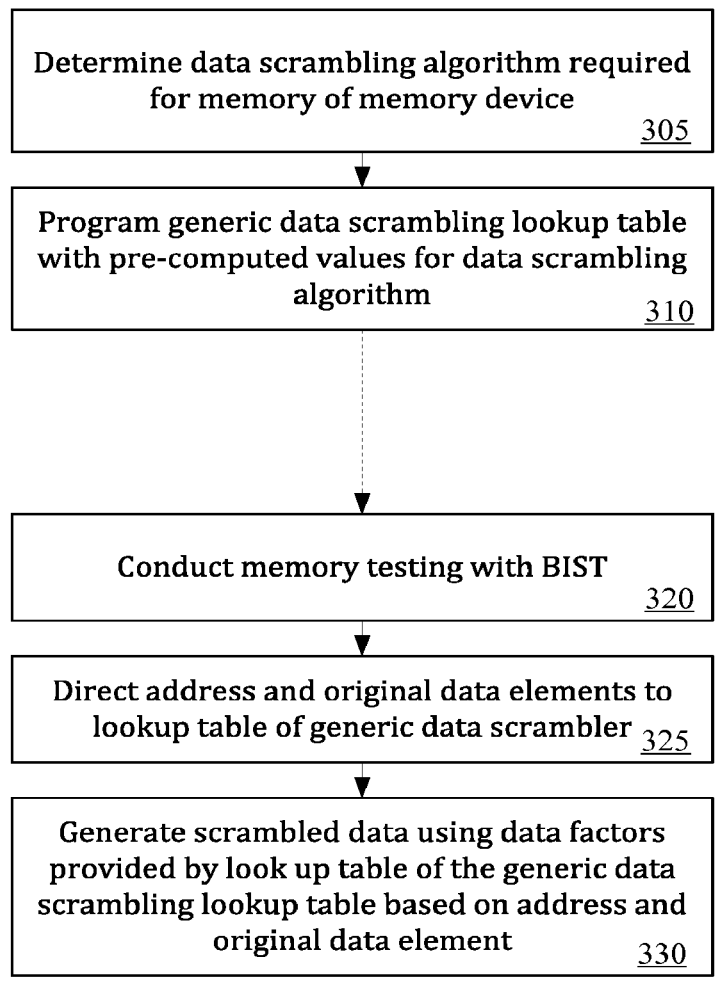
FIG. 3 is flowchart to illustrate an embodiment of a process for generic data scrambling for a stacked memory device.

FIG. 3 is flowchart to illustrate an embodiment of a process for generic data scrambling for a stacked memory device. In some embodiments, a process includes determining the data scrambling algorithm required for a particular memory 305, such as a DRAM memory of a stacked memory device. In some embodiments, a generic data scrambling lookup table is programmed with pre-computed entries for data factors for used in generated scrambled data 310.

In some embodiments, memory testing for the DRAM may be conducted with BIST of the memory device 320. In some embodiments, address and original data are to be directed to the lookup table of the generic data scrambler 325. The application of the address and original data may include additional elements, such as, for example, the elements illustrated in FIGS. 5A and 5B. In some embodiments, scrambled data is to be generated using data factors provided by a look up table of the generic data scrambling lookup table 330, the data factors being based on the address data values.

An illustration of a data scrambling algorithm for generation of factors for operation with a data element is provided in provided in Equation 1.

$$DQi = [(((((X6.OR.(X4.OR.X5)).AND.X2).OR.X2).NOR.X5).AND.X0) \text{ AND } (((((X6.OR.(X4.AND.X5)).XOR(X2)).NAND.(X1)).AND.(X3)).AND.X0) \text{ XOR } ((((.NOT.(X6.NOR.(X4.AND.X5)).OR.X0).AND.((NOT.(((X6.OR.(X4.AND.X5))))] \qquad [\text{Eq. 1}]$$

As shown in Equation 1, each data factor (DQi), where, for example, i may be values 0 through 31 for 32 bits of data, may require a series of operations. The complexity of such operations thus implies that including hard-wiring for multiple algorithms will generally be impractical. Further, if instead the calculations are performed as needed by a processor the number of calculations results in significant delay in operation.

Figure 4:
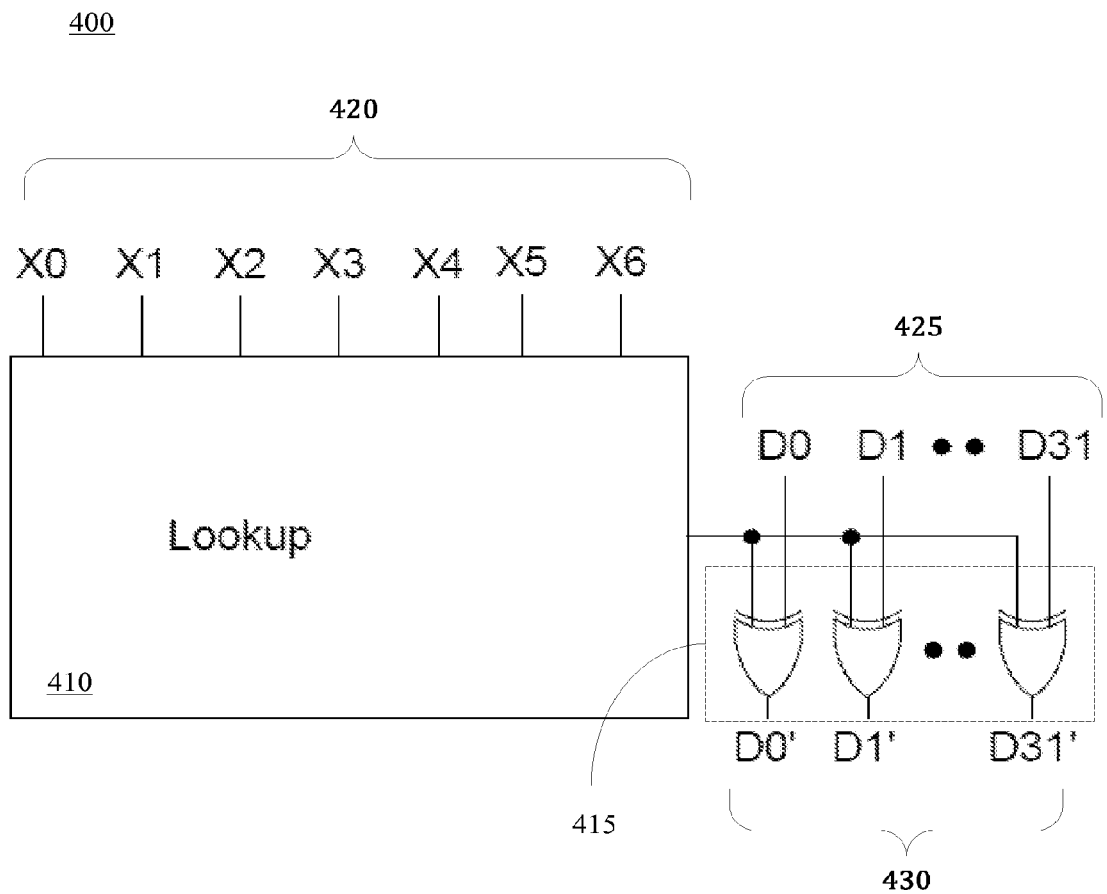
FIG. 4 is an illustration of an embodiment of a generic data scrambler utilizing a lookup table.

FIG. 4 is an illustration of an embodiment of a generic data scrambler utilizing a lookup table. In some embodiments, a generic data scrambler 400 includes a lookup table 410 receiving an address composed of address bits X0 through X6 420 and a set of logic gates (illustrated as XOR gates) 415 to receive each bit of a data element composed of data bits D0 through D31 425. In some embodiments, in a first step each element of the lookup table is pre-computed, with the seven bits implying a $2^7 = 128$ values. In some embodiments, the pre-computation of the values allows for rapid determination of values for data scrambling. In some embodiments, the lookup table 410 generates a set of data factors DQi, where i=0 to 31, for input to the logic gates 415 to generate a scrambled data element composed of data values D0' through D31' 430.

In some embodiments, the generic data scrambler 400 allows for the determination of any data factor for application to the logic gates that is based on the address. In some embodiments, the pre-computation of values and loading into the lookup table allows a BIST to operate in testing of memory utilizing varying different data scrambling schemes without modification of the BIST or the generic data scrambler.

Figure 5A:
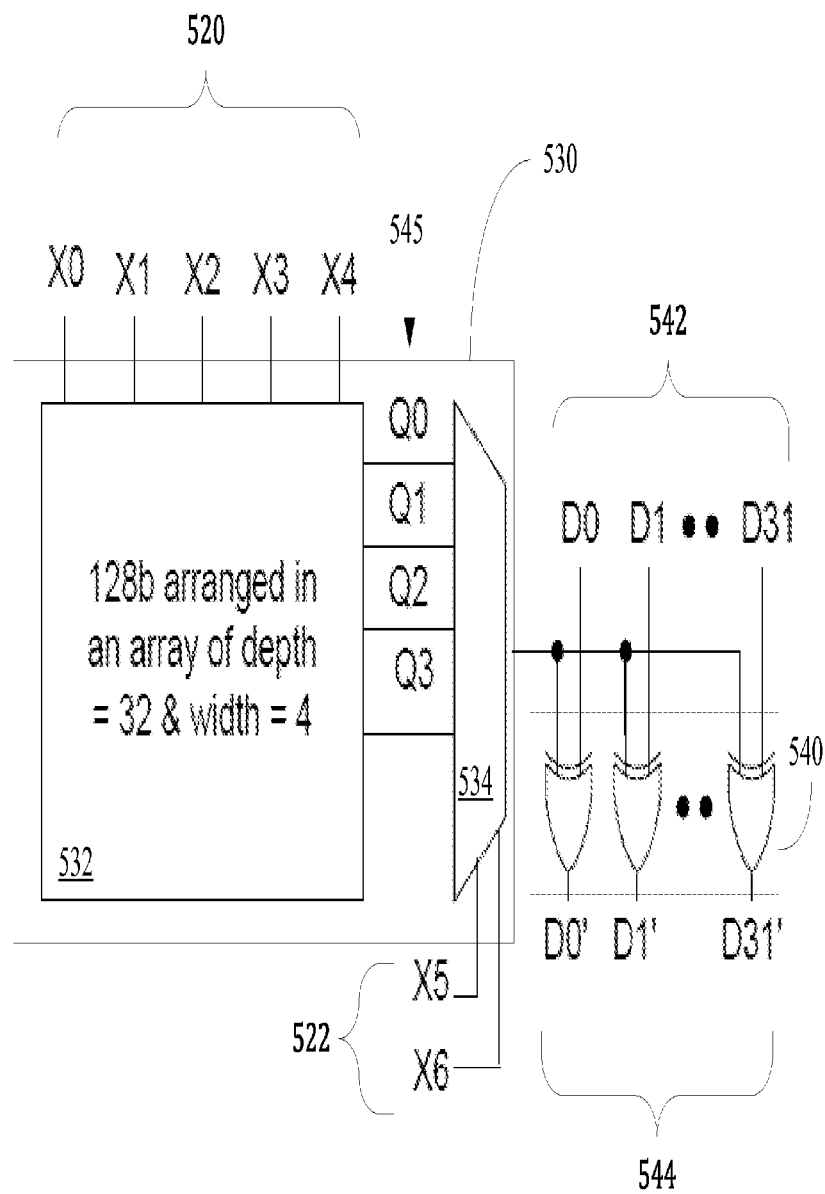
FIG. 5A is an illustration of an embodiment of a generic data scrambler including a certain register file implementation.

FIG. 5A is an illustration of an embodiment of a generic data scrambler including a certain register file implementation. In some embodiments, a generic data scrambler 500 includes a lookup table 530, and a set of logic gates 540. In this implementation, the lookup table 530 includes a register file 532 arrayed with depth of 32 and a width of 4 and a multiplexer 534.

In this illustration, the lookup table 530 receives address bits X0 to X6, the lookup table using values X0 to X4 520 to obtain pre-computed values from the register file 532, and using bits X5 and X6 as a 2-bit selection signal 522 for the multiplexer 534. In some embodiments, the register file 532 selects data factors Q0 through Q3 545, where the selection signal 522 for multiplexer 534 operates to select the appropriate the data factor of the data factors application to the logic gates 540. The logic gates 540 receive data bits D0 through D31 542, and process the data bits 542 according to the selected data factor to generate a scrambled data element composed of data values D0' through D31' 544.

Figure 5B:
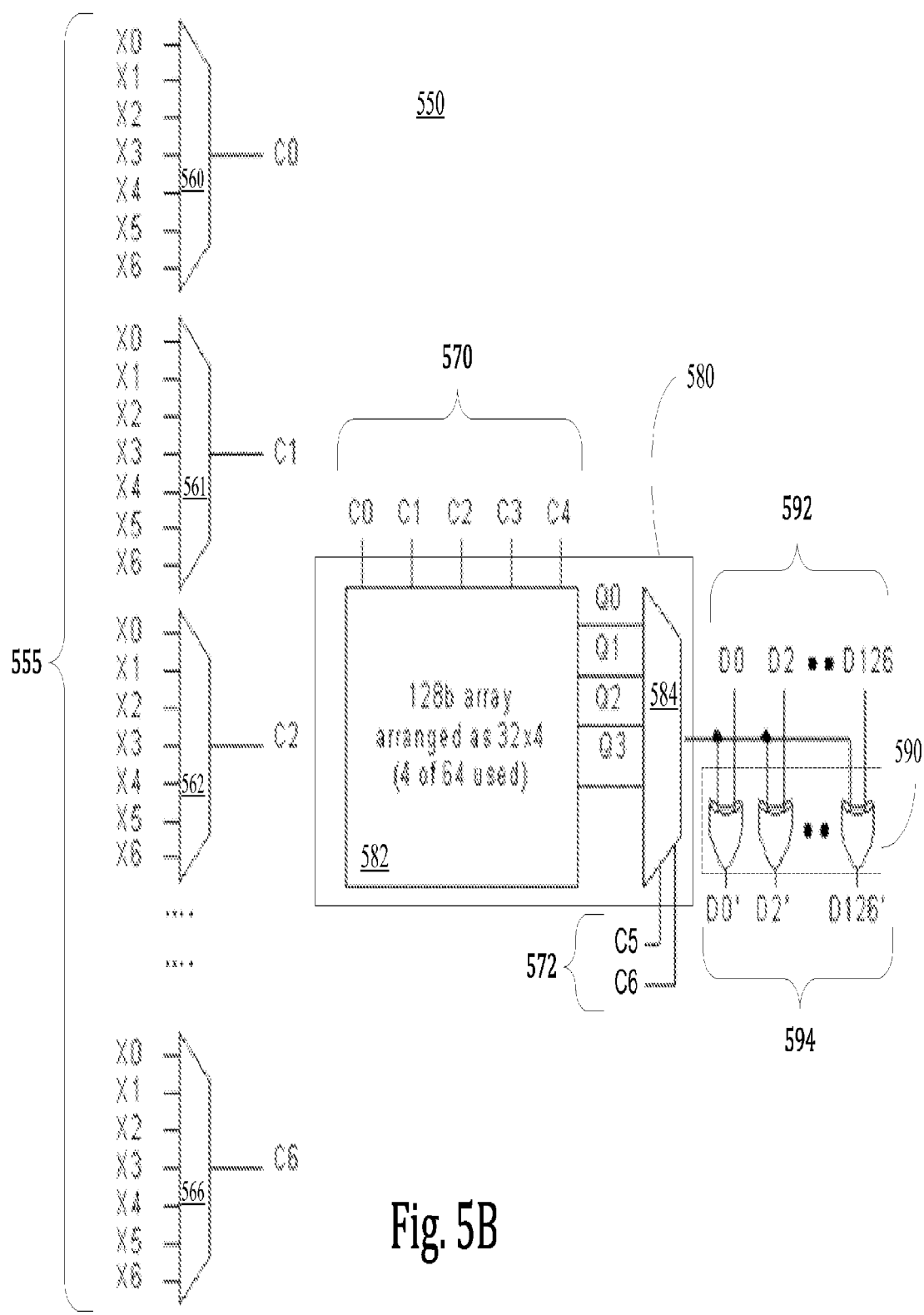
FIG. 5B is an illustration of an embodiment of a generic data scrambler including input multiplexers and register file.

FIG. 5B is an illustration of an embodiment of a generic data scrambler with an implementation including input multiplexers and register file. In some embodiments, a generic data structure may provide for separate determination of odd and even bits. FIG. 5B illustrates an Even DQ structure, where there in this implementation there is also a duplicate Odd DQ structure that is not illustrated. In some embodiments, a generic data scrambler 550 includes a set of input multiplexers 560-566, a lookup table 580, and a set of logic gates 590, the input multiplexers 560-566 providing further selectivity for a greater number of data bits.

In this implementation, address bits X0 to X6 are received 555 at each of a plurality of multiplexers 560-566, with multiplexer 560 selecting an input to generate signal C0, multiplexer 561 selecting an input to generate signal C1, multiplexer 562 selecting an input to generate signal C2, and continuing through multiplexer 566 selecting an input to generate signal C6. In this implementation, the lookup table 580 includes a register file 582 arrayed with depth of 32 and a width of 4 (this being 4 of the 64 sets used in this implementation) and a multiplexer 584. In this illustration, the lookup table 580 receives signals C0 to C6, the lookup table using values C0 to C4 570 to obtain pre-computed values from the register file 582, and using bits C5 and C6 as a 2-bit selection signal 572 for the multiplexer 584. In some embodiments, the register file 582 selects data factors Q0 through Q3, where the selection signal 572 for multiplexer 584 operates to select the appropriate data factor of the data factors for application to the logic gates 590. In this illustration, the logic gates 590 receive even data bits D0, D2, and continuing through D126 592, and process the data bits 592 according to the selected data factor to generate a portion or a scrambled data element composed of even data values D0' through D126' 594. The parallel Odd DQ structure, which is not illustrated here, operates in the same manner to generate odd data values D1' through D127'.

Figure 6:
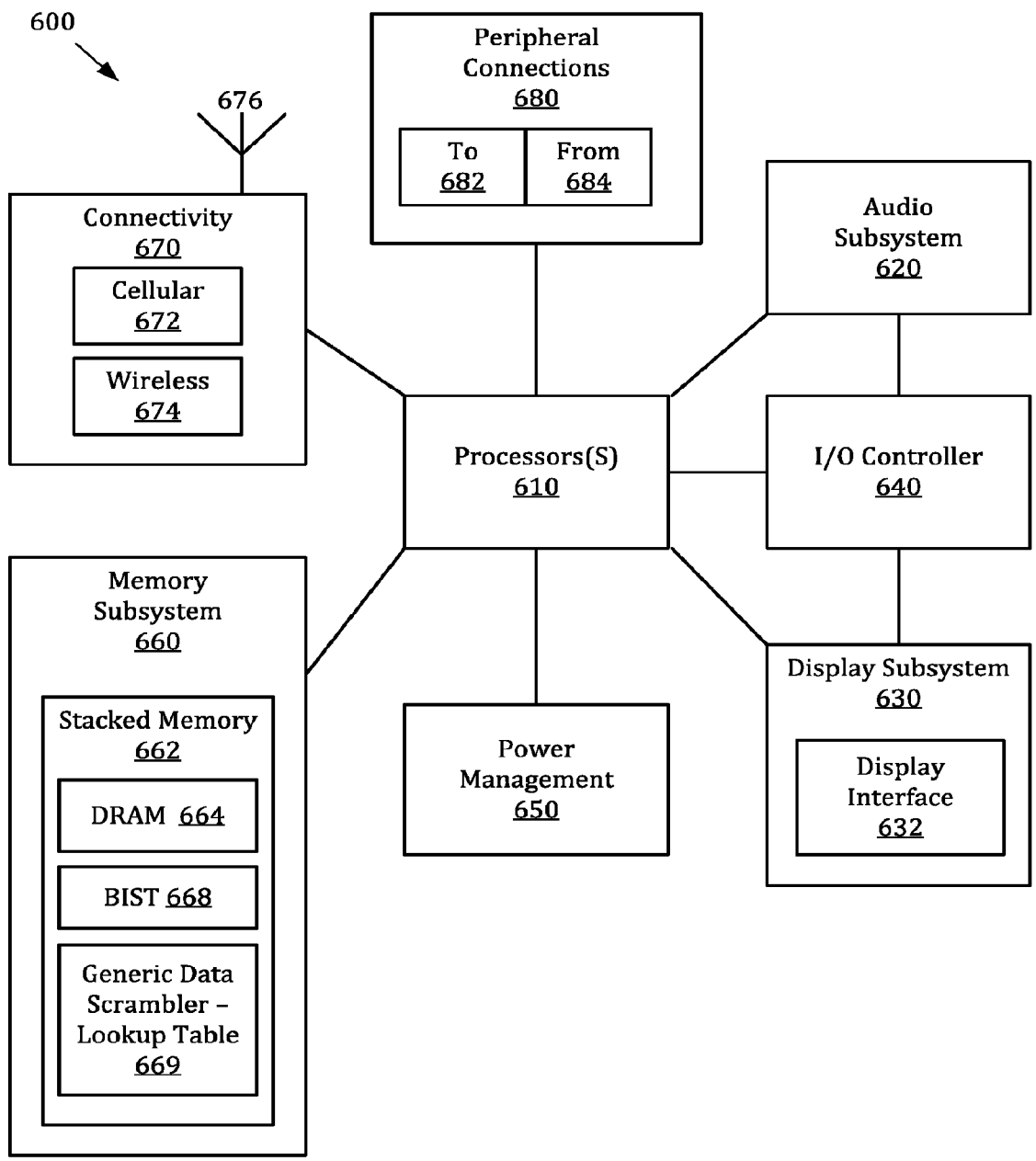
FIG. 6 is an illustration of an embodiment of an apparatus or system including elements for a generic data scrambler for a memory device.

FIG. 6 is an illustration of an embodiment of an apparatus or system including elements for a generic data scrambler for a memory device. Computing device 600 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smart phone, a wireless-enabled e-reader, or other wireless mobile device. It will be understood that certain of the components are shown generally, and not all components of such a device are shown in device 600. The components may be connected by one or more buses or other connections 605.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications, device functions, or both are executed. The processing operations include operations related to I/O (input/output) with a human user or with other devices, operations related to power management, operations, or both related to connecting device 600 to another device. The processing operations may also include operations related to audio I/O, display I/O, or both.

In one embodiment, device 600 includes audio subsystem 620, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 600, or connected to device 600. In one embodiment, a user interacts with device 600 by providing audio commands that are received and processed by processor 610.

Display subsystem 630 represents hardware (such as display devices) and software (such as drivers) components that provide a display having visual, tactile, or both elements for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen device that provides both output and input to a user.

I/O controller 640 represents hardware devices and software components related to interaction with a user. I/O controller 640 can operate to manage hardware that is part of audio subsystem 620, a display subsystem 630, or both such subsystems. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620, display subsystem 630, or both such subsystems. For example, input through a microphone or other audio device can provide input or commands for one or more applications or functions of device 600. Additionally, audio output can be provided instead of or in addition to display output. In another example, if display subsystem includes a touch screen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, or other hardware that can be included in device 600. The input can be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation.

In some embodiments, memory subsystem 660 includes memory devices for storing information in device 600. The processor 610 may read and write data to elements of the memory subsystem 660. Memory can include nonvolatile (having a state that does not change if power to the memory device is interrupted), volatile (having a state that is indeterminate if power to the memory device is interrupted) memory devices, or both such memories. Memory 660 can store application data, user data, music, photos, documents, or other data, as well as system data (whether long-term or temporary) related to the execution of the applications and functions of system 600.

In some embodiments, the memory subsystem 660 may include a stacked memory device 662, where the stacked memory device includes one or more DRAM memory die layers 664, BIST logic 668 for the testing of the DRAM 664, and a generic data scrambler including lookup table 669 for the generation of scrambled data according a scrambling algorithm for the DRAM 664.

Connectivity 670 includes hardware devices (e.g., connectors and communication hardware for wireless communication, wired communication, or both) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 674 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 676.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (such as downloading, uploading, changing, or synchronizing) content on device 600. Additionally, a docking connector can allow device 600 to connect to certain peripherals that allow device 600 to control content output, for example, to audio-visual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 7:
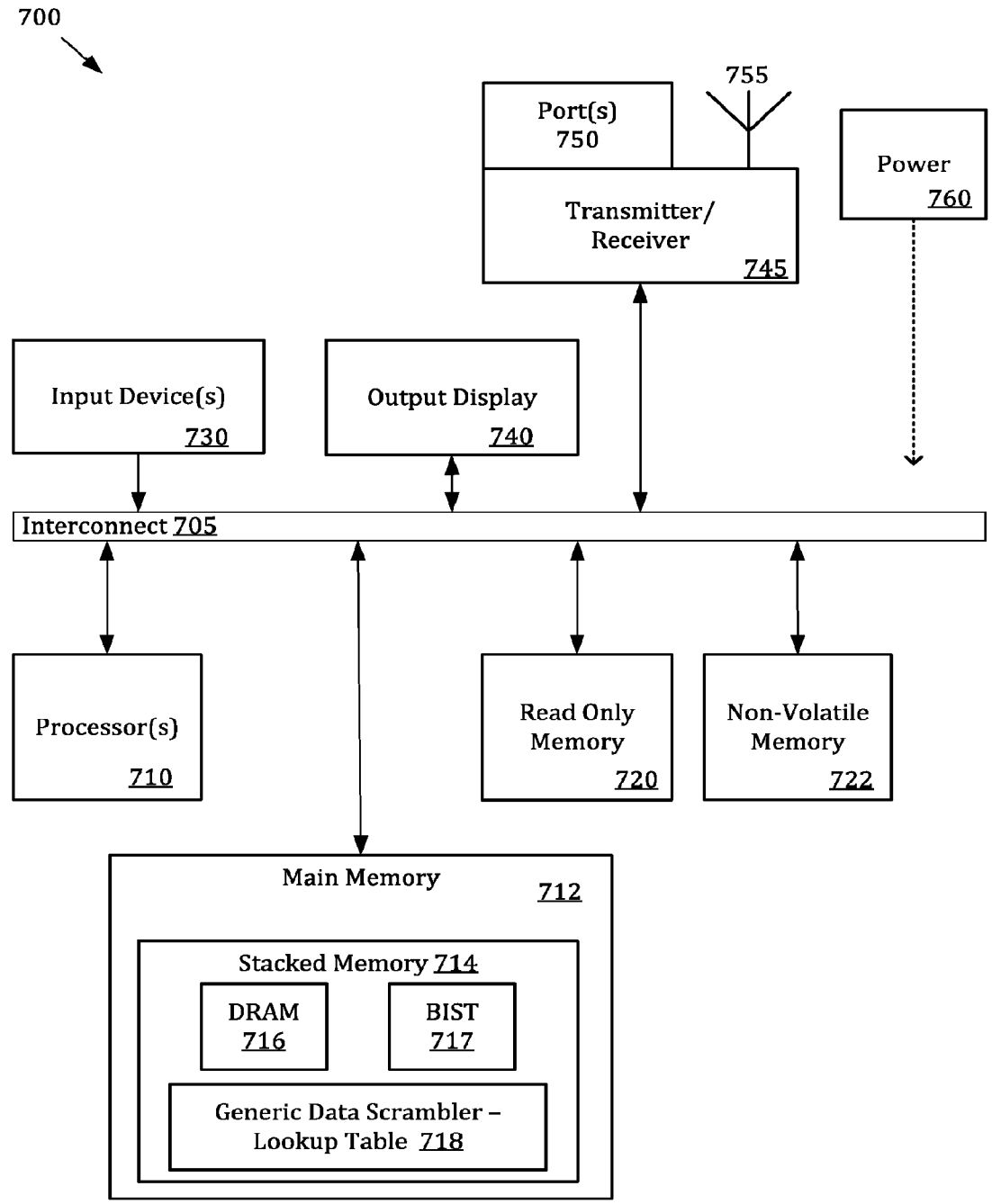
FIG. 7 illustrates an embodiment of a computing system including elements for a generic data scrambler for a memory device.

FIG. 7 illustrates an embodiment of a computing system including elements for a generic data scrambler for a memory device. The computing system may include a computer, server, game console, or other computing apparatus. In this illustration, certain standard and well-known components that are not germane to the present description are not shown. Under some embodiments, the computing system 700 comprises an interconnect or crossbar 705 or other communication means for transmission of data. The computing system 700 may include a processing means such as one or more processors 710 coupled with the interconnect 705 for processing information. The processors 710 may comprise one or more physical processors and one or more logical processors. The interconnect 705 is illustrated as a single interconnect for simplicity, but may represent multiple different interconnects or buses and the component connections to such interconnects may vary. The interconnect 705 shown in FIG. 7 is an abstraction that represents any one or more separate physical buses, point-to-point connections, or both connected by appropriate bridges, adapters, or controllers.

In some embodiments, the computing system 700 further comprises a random access memory (RAM) or other dynamic storage device or element as a main memory 712 for storing information and instructions to be executed by the processors 710. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 712 may include a stacked memory device 714, where the stacked memory device includes one or more DRAM memory die layers 716, BIST logic 717 for the testing of the DRAM 716, and a generic data scrambler including lookup table 718 for the generation of scrambled data according to a scrambling algorithm for the DRAM 716.

The computing system 700 also may comprise a read only memory (ROM) 720 or other static storage device for storing static information and instructions for the processors 710. The computing system 700 may include one or more nonvolatile memory elements 722 for the storage of certain elements.

In some embodiments, the computing system 700 includes one or more input devices 730, where the input devices include one or more of a keyboard, mouse, touch pad, voice command recognition, gesture recognition, or other device for providing an input to a computing system.

The computing system 700 may also be coupled via the interconnect 705 to an output display 740. In some embodiments, the display 740 may include a liquid crystal display (LCD) or any other display technology, for displaying information or content to a user. In some environments, the display 740 may include a touch-screen that is also utilized as at least a part of an input device. In some environments, the display 740 may be or may include an audio device, such as a speaker for providing audio information.

One or more transmitters or receivers 745 may also be coupled to the interconnect 705. In some embodiments, the computing system 700 may include one or more ports 750 for the reception or transmission of data. The computing system 700 may further include one or more omnidirectional or directional antennas 755 for the reception of data via radio signals.

The computing system 700 may also comprise a power device or system 760, which may comprise a power supply, a battery, a solar cell, a fuel cell, or other system or device for providing or generating power. The power provided by the power device or system 760 may be distributed as required to elements of the computing system 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, a memory device includes a memory; a memory controller for the memory; a BIST circuit for the testing of the memory; and a generic data scrambler for scrambling of data according to a scrambling algorithm for the memory, each algorithm being based at least in part on values of an address for data. In some embodiments, the generic data scrambler includes a programmable lookup table to hold values for each possible outcome of the algorithm, the lookup table to generate a set of data factors, and a logic for combining the data with the data factors to generate scrambled data.

In some embodiments, the lookup table includes a register file, values of the register file being selected based on the value of at least a portion of bits of the address. In some embodiments, the lookup table further includes a multiplexer, the multiplexer to choose one of a plurality of sets of values of the register file based on one or more bits of the address.

In some embodiments, the scrambling algorithm is a function of the address.

In some embodiments, the BIST circuit and the generic data scrambler may be utilized with a plurality of different scrambling algorithms.

In some embodiments, the memory device is a stacked memory device includes a memory stack of one or more memory layers and a system element.

In some embodiments, the memory controller, BIST circuit, and generic data scrambler are part of the system element. In some embodiments, the system element is an SoC.

In some embodiments, the BIST circuit provides for testing after assembly of the memory device including one or more of verifying operation of memory of the memory device, and verifying connection of the memory to logic components. In some embodiments, the BIST circuit provides for testing in operation of the memory device, wherein the testing in operation of the memory device may include a power on self-test of the memory device.

In some embodiments, a method includes pre-computing data values for a data scrambling algorithm for a memory device; loading the pre-computed data values into a lookup table of the memory device; receiving an address and original data for the memory device; determining a set of data values from the lookup table based on the address; and combining the original data with the determined set of data factors to generate scrambled data.

In some embodiments, the method further includes performing a test of the memory device using a BIST circuit of the memory device, the test of the memory device utilizing the scrambled data.

In some embodiments, performing the test includes testing after assembly of the memory device including one or more of verifying operation of memory of the memory device, and verifying connection of the memory to logic components. In some embodiments, performing the test includes testing in operation of the memory device, wherein testing in operation of the memory device may include a power on self-test of the memory device.

In some embodiments, combining the original data with the determined set of data factors includes XOR operations of the data with the set of data factors. In some embodiments, the memory device is a stacked memory device including a memory stack of one or more memory layers and a system element.

In some embodiments, a system includes a bus to connect elements of the system; a processor coupled with the bus to process data for the system; a transmitter to transmit data, a receiver to receive data, or both; an omnidirectional antenna for data transmission, data reception or both; and memory coupled to the bus to hold data for processing by the processor, the memory including a stacked memory device, the stack memory device including a DRAM memory, a memory controller for the memory, a BIST circuit for the testing of the memory, and a generic data scrambler for scrambling of data according to an scrambling algorithm for the memory, each algorithm being based at least in part on on values of an address for data. In some embodiments, the generic data scrambler includes a programmable lookup table to hold values for each possible outcome of the algorithm, the lookup table to generate a set of data factors, and a logic for combining the data with the data factors to generate scrambled data.

In some embodiments, the lookup table includes a register file, values of the register file being selected based on the value of at least a portion of bits of the address. In some embodiments, the lookup table includes a multiplexer, the multiplexer to choose one of a plurality of sets of values of the register file based on one or more bits of the address.

In some embodiments, the system is one of a computing system, where the computing system may be a tablet computer.

In some embodiments, a non-transitory computer-readable storage medium having stored thereon data representing sequences of instructions that, when executed by a processor, cause the processor to perform operations including pre-computing data values for a data scrambling algorithm for a memory device; loading the pre-computed data values into a lookup table of the memory device; receiving an address and original data for the memory device; determining a set of data values from the lookup table based on the address; and combining the original data with the determined set of data factors to generate scrambled data.

In some embodiments, the medium includes instructions for performing a test of the memory device using a BIST circuit of the memory device, the test of the memory device utilizing the scrambled data.

What is claimed is:

1. A stacked memory device comprising:
 a memory stack including one or more memory die layers; and
 a system element coupled with the memory stack, the system element including:
  a memory controller for the memory stack,
  a built-in self-test (BIST) circuit to test the memory stack, and
  a generic data scrambler to scramble data for the testing of the memory stack, the scrambling of the data being performed according to a data scrambling algorithm for the memory stack, the data scrambling algorithm to provide mapping between logical locations and physical locations for data storage in the memory stack, the operation of the data scrambling algorithm being based at least in part on values of addresses for data, wherein the generic data scrambler includes:
   a programmable lookup table to hold data factors for each possible outcome of the data scrambling algorithm, the programmable lookup table to generate a set of data factors based on addresses of the data for testing of the memory stack, and
   a determination logic to combine the data for the testing of the memory stack with the data factors generated by the programmable lookup table to generate scrambled data;
 wherein the BIST circuit and generic data scrambler are operable to implement multiple different data scrambling algorithms to support mappings between logical addresses and physical addresses for different memory types.

2. The stacked memory device of claim 1, wherein the lookup table includes a register file, values of the register file to be selected based on a value of at least a portion of bits of each of the addresses of the data for testing of the memory stack.

3. The stacked memory device of claim 2, wherein the programmable lookup table includes a multiplexer, the multiplexer to choose one of a plurality of sets of values of the register file based on one or more bits of each of the addresses of the data for testing of the memory stack.

4. The stacked memory device of claim 1, wherein the data scrambling algorithm is a function utilizing the addresses of data.

5. The stacked memory device of claim 1, wherein the system element is a system on chip (SoC).

6. The stacked memory device of claim 1, wherein the BIST circuit is to provide for testing after assembly of the stacked memory device including one or more of verifying operation of memory of the stacked memory device, and verifying connection of the memory to one or more logic components.

7. The stacked memory device of claim 1, wherein the BIST circuit is to provide for testing in operation of the stacked memory device.

8. The stacked memory device of claim 7, wherein the testing in operation of the stacked memory device includes a power on self-test of the stacked memory device.

9. A method comprising:
pre-computing data factors for a data scrambling algorithm for a stacked memory device including a system element and a memory stack with one or more memory die layers, the data scrambling algorithm providing mapping between logical locations and physical locations for data storage in the memory stack;
loading the pre-computed data factors into a lookup table of a generic data scrambler of the stacked memory device, the lookup table to hold data factors for each possible outcome of the data scrambling algorithm;
receiving original data for testing of the memory stack of the stacked memory device and addresses for the original data;
determining a set of data factors for the testing of the memory stack from the lookup table based on the addresses for the original data; and
combining the original data for testing of the memory stack with the determined set of data factors from the lookup table to generate scrambled data according to the data scrambling algorithm.

10. The method of claim 9, further comprising performing a test of the stacked memory device using a BIST (built-in self-test) circuit of the stacked memory device, the test of the stacked memory device utilizing the scrambled data.

11. The method of claim 10, wherein performing the test of the stacked memory device includes testing after assembly of the stacked memory device, testing including one or more of verifying operation of memory of the stacked memory device, and verifying connection of the memory to one or more logic components.

12. The method of claim 10, wherein performing the test of the stacked memory device includes testing in operation of the stacked memory device in operation.

13. The method of claim 12, wherein testing in operation of the stacked memory device includes a power on self-test of the stacked memory device.

14. The method of claim 9, wherein combining the original data with the determined set of data factors includes XOR (exclusive OR) operations of the original data with the set of data factors.

15. A system including:
a bus to connect elements of the system;
a processor coupled with the bus to process data for the system;
a transmitter to transmit data, a receiver to receive data, or both a transmitter to transmit data and a receiver to receive data;
an omnidirectional antenna for data transmission, data reception, or both; and
memory coupled to the bus to hold data for processing by the processor, the memory including a stacked memory device, the stacked memory device including:
a memory stack including one or more layers of DRAM (dynamic random access) memory,
a system element coupled with the memory stack, the system element including:
a memory controller for the memory stack,
a built-in self-test (BIST) circuit to test the memory stack, and
a generic data scrambler to scramble data for the testing of the memory stack, the scrambling of the data being performed according to a data scrambling algorithm for the memory stack, the data scrambling algorithm to provide mapping between logical locations and physical locations for data storage in the memory stack, the operation of the data scrambling algorithm being based at least in part on values of addresses for data, wherein the generic data scrambler includes:
a programmable lookup table to hold data factors for each possible outcome of the data scrambling algorithm, the lookup table to generate a set of data factors based on addresses of the data for testing of the memory stack, and
a determination logic to combine the data for the testing of the memory stack with the data factors generated by the programmable lookup table to generate scrambled data;
wherein the BIST circuit and generic data scrambler are operable to implement multiple different data scrambling algorithms to support mappings between logical addresses and physical addresses for different memory types.

16. The system of claim 15, wherein the lookup table includes a register file, values of the register file to be selected based on a value of at least a portion of bits of each of the addresses of the data for testing of the memory stack.

17. The system of claim 16, wherein the lookup table includes a multiplexer, the multiplexer to choose one of a plurality of sets of values of the register file based on one or more bits of each of the addresses of the data for testing of the memory stack.

18. The system of claim 15, wherein the system is a computing system.

19. The system of claim 18, wherein the computing system is a tablet computer.

20. A non-transitory computer-readable storage medium having stored thereon data representing sequences of instructions that, when executed by a processor, cause the processor to perform operations comprising:
pre-computing data factors for a data scrambling algorithm for a stacked memory device including a system element and a memory stack with one or more memory die layers, the data scrambling algorithm providing mapping between logical locations and physical locations for data storage in the memory stack;
loading the pre-computed data factors into a lookup table of a generic data scrambler of the stacked memory device, the lookup table to hold data factors for each possible outcome of the data scrambling algorithm;
receiving original data for testing of the memory stack of the stacked memory device and addresses for the original data;
determining a set of lookup values for the testing of the memory stack from the lookup table based on the addresses for the original data; and
combining the original data for testing of the memory stack with the determined set of data factors from the lookup table to generate scrambled data according to the data scrambling algorithm.

21. The medium of claim 20, further comprising instructions that, when executed by a processor, cause the processor to perform operations comprising:
performing a test of the stacked memory device using a BIST (built-in self-test) circuit of the stacked memory device, the test of the stacked memory device utilizing the scrambled data.

22. The stacked memory device of claim 1, further comprising a tap input to load data factors for the data scrambling algorithm into the lookup table.

23. The stacked memory device of claim 1, wherein the determination logic includes multiple logic gates.

24. The system of claim 15, wherein the stacked memory device further includes a tap input to load data factors for the data scrambling algorithm into the lookup table.

25. The system of claim 15, wherein the determination logic includes multiple logic gates.

\* \* \* \* \*